United States Patent
Pang et al.

(10) Patent No.: US 9,711,489 B2
(45) Date of Patent: Jul. 18, 2017

(54) MULTIPLE PIXEL SURFACE MOUNT DEVICE PACKAGE

(71) Applicant: CREE HUIZHOU SOLID STATE LIGHTING COMPANY LIMITED, Huizhou, Guangdong (CN)

(72) Inventors: Chak Hau Charles Pang, Fanling (HK); Chi Keung Alex Chan, Sheung Shui (HK); David Emerson, Chapel Hill, NC (US); Yue Kwong Victor Lau, Laguna (HK); Zhenyu Zhong, The Wings (HK)

(73) Assignee: CREE HUIZHOU SOLID STATE LIGHTING COMPANY LIMITED, Huizhou, Guangdong (CN)

( * ) Notice: Subject to any disclaimer, the term of this patent is extended or adjusted under 35 U.S.C. 154(b) by 0 days.

(21) Appl. No.: 13/904,282

(22) Filed: May 29, 2013

(65) Prior Publication Data
US 2014/0353694 A1 Dec. 4, 2014

(51) Int. Cl.
*H01L 33/62* (2010.01)
*H01L 25/075* (2006.01)
(Continued)

(52) U.S. Cl.
CPC .......... *H01L 25/0753* (2013.01); *H01L 24/97* (2013.01); *H01L 33/62* (2013.01);
(Continued)

(58) Field of Classification Search
CPC ........ H01L 25/00–25/50; H01L 33/00–33/648
(Continued)

(56) References Cited

U.S. PATENT DOCUMENTS 4,946,547 A 8/1990 Palmour
5,200,022 A 4/1993 Kong
(Continued)

FOREIGN PATENT DOCUMENTS

CN 1875491 12/2006
CN 1875495 12/2006
(Continued)

OTHER PUBLICATIONS

Office Action from U.S. Appl. No. 12/758,702, dated: Oct. 9, 2012.
(Continued)

*Primary Examiner* — Eric Ward
(74) *Attorney, Agent, or Firm* — Koppel, Patrick, Heybl & Philpott

(57) ABSTRACT

Emitter packages and LEDs displays utilizing the packages are disclosed, with the packages providing advantages such as reducing the cost and interconnect complexity for the packages and displays. One emitter package comprises a casing with a plurality of cavities, each cavity having at least one LED. A lead frame structure is included integral to the casing, with the at least one LED from each of the cavities mounted to the lead frame structure. The package is capable of receiving electrical signals for independently controlling the emission from a first and second of the cavities. One LED display utilizes the LED packages mounted in relation to one another to generate a message or image. The LED packages comprise multiple pixels each having at least one LED, with each package capable of receiving electrical signals for independently controlling the emission of at least a first and second of the pixels.

41 Claims, 11 Drawing Sheets

(51) Int. Cl.
*H01L 23/00* (2006.01)
*H01L 33/50* (2010.01)

(52) U.S. Cl.
CPC .... *H01L 33/50* (2013.01); *H01L 2224/48091* (2013.01); *H01L 2224/48247* (2013.01); *H01L 2924/12041* (2013.01)

(58) Field of Classification Search
USPC .............. 257/79–103; 345/30–111; 362/231, 362/249.02–249.06; 438/22–47
See application file for complete search history.

(56) References Cited

U.S. PATENT DOCUMENTS

| | | | |
|---|---|---|---|
| 5,266,817 A | 11/1993 | Lin | 257/89 |
| RE34,861 E | 2/1995 | Davis | |
| 5,410,328 A * | 4/1995 | Yoksza et al. | 345/82 |
| 6,624,491 B2 | 9/2003 | Waitl | 257/434 |
| 7,071,620 B2 * | 7/2006 | Devos et al. | 313/512 |
| 7,102,601 B2 * | 9/2006 | Devos | G06F 3/1446 257/88 |
| 7,394,148 B2 | 7/2008 | Karnezos | 257/686 |
| 7,455,423 B2 * | 11/2008 | Takenaka | 362/231 |
| 7,476,003 B2 * | 1/2009 | Kim | 362/231 |
| 7,566,160 B2 * | 7/2009 | Song et al. | 362/613 |
| 7,850,336 B2 * | 12/2010 | Kim et al. | 362/231 |
| 7,922,352 B2 * | 4/2011 | Chua et al. | 362/231 |
| 7,993,022 B2 * | 8/2011 | Bertram | 362/97.3 |
| 8,288,793 B2 | 10/2012 | Kim et al. | 257/99 |
| 8,525,952 B2 * | 9/2013 | Tanaka et al. | 349/69 |
| 8,827,479 B2 * | 9/2014 | Kobayashi et al. | 362/97.1 |
| 2004/0046242 A1 | 3/2004 | Asakawa | 257/678 |
| 2004/0079957 A1 | 4/2004 | Andrews et al. | 257/100 |
| 2004/0120155 A1 | 6/2004 | Suenaga | 362/362 |
| 2005/0099808 A1* | 5/2005 | Cheng et al. | 362/231 |
| 2006/0102918 A1 | 5/2006 | Su et al. | 257/99 |
| 2007/0235845 A1 | 10/2007 | Xuan | 257/676 |
| 2007/0262328 A1 | 11/2007 | Bando | |
| 2007/0295975 A1 | 12/2007 | Omae | 257/89 |
| 2008/0002100 A1* | 1/2008 | Kaneko | G02F 1/133603 349/65 |
| 2008/0012036 A1 | 1/2008 | Loh et al. | 257/99 |
| 2008/0041625 A1 | 2/2008 | Cheong | |
| 2008/0093720 A1 | 4/2008 | Hiew et al. | 257/679 |
| 2008/0277685 A1 | 11/2008 | Kim et al. | |
| 2009/0050907 A1 | 2/2009 | Yuan et al. | 257/88 |
| 2009/0057850 A1 | 3/2009 | Moy | |
| 2009/0072251 A1 | 3/2009 | Chan et al. | 257/89 |
| 2009/0129073 A1* | 5/2009 | Yaw et al. | 362/231 |
| 2009/0129085 A1 | 5/2009 | Aizar et al. | 362/247 |
| 2009/0230413 A1 | 9/2009 | Kobayakawa et al. | |
| 2009/0283781 A1 | 11/2009 | Chan et al. | |
| 2010/0084681 A1 | 4/2010 | Nakajima et al. | 257/99 |
| 2010/0090239 A1 | 4/2010 | Lin et al. | 257/98 |
| 2010/0110659 A1* | 5/2010 | Nakajima | 362/84 |
| 2010/0155748 A1 | 6/2010 | Chan | |
| 2010/0193816 A1 | 8/2010 | Liu | 257/98 |
| 2010/0237378 A1 | 9/2010 | Lin et al. | 257/98 |
| 2011/0095316 A1 | 4/2011 | Chen et al. | 257/98 |
| 2012/0025227 A1* | 2/2012 | Chan et al. | 257/89 |
| 2012/0235187 A1* | 9/2012 | Ng et al. | 257/98 |
| 2015/0204525 A1* | 7/2015 | Shen | H01L 33/62 362/231 |

FOREIGN PATENT DOCUMENTS

| | | |
|---|---|---|
| CN | 101071797 | 4/2007 |
| CN | 101012330 | 8/2007 |
| CN | 101164165 | 4/2008 |
| CN | 101388161 | 3/2009 |
| CN | 201294227 | 8/2009 |
| CN | 102214647 | 10/2011 |
| EP | 2148369 A1 | 1/2010 |
| JP | 058960 | 5/1993 |
| JP | 2004228387 | 8/2004 |
| JP | 200847916 | 2/2008 |
| JP | 200898218 | 4/2008 |
| JP | 2008218764 | 9/2008 |
| JP | 2009200403 | 9/2009 |
| TW | I245437 | 6/2006 |
| WO | WO 2010/081403 A1 | 7/2010 |
| WO | WO 2010081403 | 7/2010 |

OTHER PUBLICATIONS

Response to Office Action from U.S. Appl. No. 12/758,702, filed Jan. 3, 2013.
Office Action from U.S. Appl. No. 12/758,702, dated: Mar. 12, 2013.
Response to Office Action from U.S. Appl. No. 12/758,702, filed Jul. 12, 2013.
Office Action from U.S. Appl. No. 12/939,096, dated: Nov. 13, 2012.
Response to Office Action from U.S. Appl. No. 12/939,096, filed Feb. 13, 2013.
Office Action from U.S. Appl. No. 12/939,096. dated: Feb. 28, 2013.
Response to Office Action from U.S. Appl. No. 12/939,096, filed May 28, 2013.
Office Action from U.S. Appl. No. 12/939,096, dated: Jun. 24, 2013.
Office Action from U.S. Appl. No. 12/957,225, dated: Mar. 25, 2013.
Response to Office Action from U.S. Appl. No. 12/957,225, filed May 15, 2013.
Office Action from U.S. Appl. No. 12/957,225, dated: Jun. 3, 2013.
Response to Office Action from U.S. Appl. No. 12/957,225, filed Jun. 7, 2013.
Office Action from U.S. Appl. No. 13/192,293. dated: Aug. 27, 2013.
Office Action from U.S. Appl. No. 12/758,702, dated Oct. 9, 2012.
Response to OA from U.S. Appl. No. 12/758,702, filed Jan. 3, 2013.
Office Action from U.S. Appl. No. 12/758,702, dated Mar. 12, 2013.
Response to OA from U.S. Appl. No. 12/758,702, filed Jul. 12, 2013.
Office Action from U.S. Appl. No. 12/939,096. dated Nov. 13, 2012.
Response to OA from U.S. Appl. No. 12/939,096. filed Feb. 13, 2013.
Office Action from U.S. Appl. No. 12/939,096, dated Feb. 28, 2013.
Response to OA from U.S. Appl. No. 12/939,096, filed May 28, 2013.
Office Action from U.S. Appl. No. 12/939,096. dated Jun. 24, 2013.
Office Action from U.S. Appl. No. 12/957,225, dated Mar. 25, 2013.
Response to OA from U.S. Appl. No. 12/957,225, filed May 15, 2013.
Office Action from U.S. Appl. No. 12/957,225, dated Jun. 3, 2013.
Response to OA from U.S. Appl. No. 12/957,225, filed Jun. 7, 2013.
Office Action from U.S. Appl. No. 13/192.293, dated Aug. 27, 2013.
Office Action from U.S. Appl. No. 12/758,702, dated Sep. 17, 2013.
Notification of Rectification from Chinese Patent Appl. No. 2013-10208431.2, dated Sep. 23. 2013.
First Notification of Rectification from Chinese Patent Appl. No. 2013-20304753.2, dated Sep. 24, 2013.
International Preliminary Report and Written Opinion for PCT Patent Application No. PCT/CN2010/001864, dated Oct. 26, 2012.
Office Action from U.S. Appl. No. 12/957,225, dated: Aug. 24, 2012.
International Search Report and Written Opinion for counterpart PCT/CN2011/077823 mailed Oct. 20, 2011.
U.S. Appl. No. 13/192,293, filed Jul. 27, 2011, Chan, et al.
U.S. Appl. No. 12/875,873, filed Sep. 3, 2010, Chan, et al.
International Search Report and Written Opinion for Appl. No. PCT/CN2010/001864. Dated Nov. 22, 2010.
U.S. Appl. No. 11/656,759, filed Jan. 22, 2007, Ashay Chitnis.
U.S. Appl. No. 11/899,790, filed Sep. 7, 2007, Ashay Chitnis.
U.S. Appl. No. 11/473,089, filed Jun. 21, 2006, Eric J. Tarsa.
T-Clad Thermal Clad insulated substrate material from The Bergquist Co. of Chanhassen, Minn., Product info overview, 3 pages.

(56) References Cited

OTHER PUBLICATIONS

Office Action from U.S. Appl. No. 12/939,096, dated Feb. 5, 2014.
Office Action from U.S. Appl. No. 13/192,293, dated Jan. 16, 2014.
Second Notification of Rectification from Chinese Patent Appl. No. 201320304753.2, dated Jan. 2, 2014.
Office Action from U.S. Appl. No. 12/957,225, dated Apr. 30, 2014.
Office Action from U.S. Appl. No. 13/192,293, dated Aug. 15, 2014.
Office Action from U.S. Appl. No. 13/192,293, dated Nov. 18, 2014.
Supplementary European Search Report from European Patent Appl. No. 10849646.4-1551/2559065, dated Apr. 9. 2015.
Office Action from U.S. Appl. No. 12/957,225, dated Jan. 21, 2015.
Office Action from Chinese Patent Appl. No. 201010621778.6, dated Dec. 31, 2014.
Extended European Search Report from European Appl. No. 10849646.4-1551, dated Mar. 19, 2015.
Office Action from U.S. Appl. No. 13/192,293, dated Jul. 31, 2015.
Response to OA from U.S. Appl. No. 13/192,293, filed Oct. 2, 2015.
Office Action from U.S. Appl. No. 12/939,096, dated Oct. 23, 2015.
Notice of Issuance from Chinese Patent Appl. No. 201010621778.6. dated Dec. 11, 2015.
Second Office Action from Chinese Patent Appl. No. 2011800455336, dated Nov. 20, 2015.
Office Action from U.S. Appl. No. 13/192,293; Dec. 22, 2015.
Office Action from U.S. Appl. No. 12/939,096, dated Apr. 8, 2015.
Office Action from U.S. Appl. No. 13/192,293, dated Apr. 21, 2015.
Office Action from Japanese Appl. No. 2013-504088, dated Jun. 2, 2015.
First Office Action from Chinese Patent Appl. No. 201180053012.5, dated Jul. 3, 2015.
First Office Action from Chinese Patent appl. No. 2011800455336, dated May 29, 2015.
Second Office Action from Chinese Patent appl. No. 201010621778.6, dated Jul. 13, 2015.
Decision of Rejection for Chinese Application No. 2011800455336; Dated Jun. 14, 2016.
Office Action from U.S. Appl. No. 12/939,096; Apr. 8, 2016.

* cited by examiner

MULTIPLE PIXEL SURFACE MOUNT DEVICE PACKAGE

BACKGROUND OF THE INVENTION

Field of the Invention

This invention relates to light emitting diode packages and displays utilizing light emitting diode packages as their light source.

Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Technological advances over the last decade or more has resulted in LEDs having a smaller footprint, increased emitting efficiency, and reduced cost. LEDs also have an increased operation lifetime compared to other emitters. For example, the operational lifetime of an LED can be over 50,000 hours, while the operational lifetime of an incandescent bulb is approximately 2,000 hours. LEDs can also be more robust than other light sources and can consume less power. For these and other reasons, LEDs are becoming more popular and are now being used in more and more applications that have traditionally been the realm of incandescent, fluorescent, halogen and other emitters.

In order to use an LED chip in conventional applications it is known to enclose an LED chip in a package to provide environmental and/or mechanical protection, color selection, light focusing and the like. An LED package also includes electrical leads, contacts or traces for electrically connecting the LED package to an external circuit. In a typical two-pin LED package/component 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup 13 may be filled with an encapsulant material 16 and a wavelength conversion material, such as a phosphor, can be included in over the LED chip or in the encapsulant. Light emitted by the LED at a first wavelength may be absorbed by the phosphor, which may responsively emit light at a second wavelength. The entire assembly can then be encapsulated in a clear protective resin 14, which may be molded in the shape of a lens to direct or shape the light emitted from the LED chip 12.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 21 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

FIG. 3 shows another LED package 30 comprising a casing 32, and a lead frame 34 at least partially embedded in the casing 32. The lead frame 34 is arranged for surface mounting of the package 30. Portions of lead frame 34 are exposed through a cavity in the casing 32 with three LEDs 36a-c mounted on part of the lead frame 34 and connected to other parts of the lead frame by wire bonds 38. Different types of LEDs 36a-c can be used, with some packages having red, green and blue emitting LEDs. The package 30 comprises a pin-out structure with six pins 40 and the lead frame is arranged so that the emission of each of the LEDs 36a-c can be controlled independently by a respective pair of the pins 40. This allows the package to emit a variety of color combinations from the LEDs 36a-c.

Different LEDs packages, such as those shown in FIGS. 1-3, can be used as the light source for signs and displays, both big and small. Large screen LED based displays (often referred to as giant screens) are becoming more common in many indoor and outdoor locations, such as at sporting arenas, race tracks, concerts and in large public areas such as Times Square in New York City. With current technology, some of these displays or screens can be as large as 60 feet tall and 60 feet wide. As technology advances it is expected that larger screens will be developed.

These screens can comprise thousands or hundreds of thousands of "pixels" or "pixel modules", each of which can contain one or a plurality of LED chips or packages. The pixel modules can use high efficiency and high brightness LED chips that allow the displays to be visible from relatively far away, even in the daytime when subject to sunlight. In some signs each pixel can have a single LED chip, and pixel modules can have as few as three or four LEDs (such as one red, one green, and one blue) that allow the pixel to emit many different colors of light from combinations of red, green and/or blue light. The pixel modules can be arranged in a rectangular grid that can include hundreds of thousands of LEDs or LED packages. In one type of display, the grid can be 640 modules wide and 480 modules high, with the size of the screen being dependent upon the actual size of the pixel modules. As the number of pixels increases, the interconnect complexity for the display also increases. This interconnect complexity can be one of the major expenses for these displays, and can be one of the major sources of failure during manufacturing and during the operational lifetime of the display.

SUMMARY OF THE INVENTION

The present invention is directed to emitter packages and LEDs displays utilizing the packages, with the packages arranged to reduce the cost and interconnect complexity for the displays. Some package embodiments are arranged to provide multiple display pixels in a single package, resulting in reduced cost per pixel and well as simplifying design and manufacturing of displays utilizing the packages.

One embodiment of solid state emitter package according to the present invention comprises multiple pixels each having at least one solid state emitter. A common submount is included for carrying electrical signals to control the emission of a first of the pixels, and to control the emission of a second of the pixels.

One embodiment of a multiple pixel emission package according to the present invention comprises a casing with a plurality of cavities, each cavity having at least one LED. A lead frame structure is included integral to the casing, with the at least one LED from each of the cavities mounted to the lead frame structure. The package is capable of receiving electrical signals for controlling the emission from a first and second of the cavities.

One embodiment of an LED display according to the present invention comprises a plurality of LED packages mounted in relation to one another to generate a message or image. At least some of the LED packages comprise multiple pixels each having at least one LED. Each of the packages is capable of receiving electrical signals for controlling the emission of at least a first and second of said pixels.

These and other aspects and advantages of the invention will become apparent from the following detailed description and the accompanying drawings which illustrate by way of example the features of the invention.

DETAILED DESCRIPTION OF THE INVENTION

Figure 1:
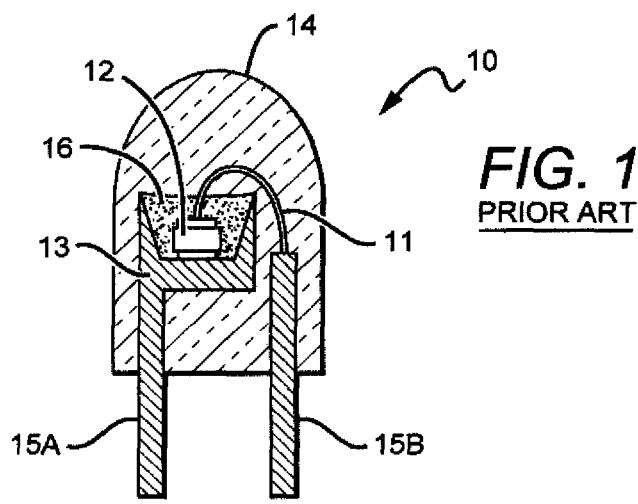
FIG. 1 is a side view of a conventional light emitting diode package.
Figure 2:
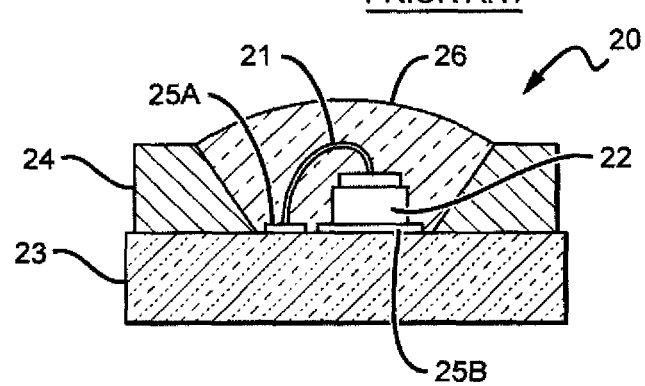
FIG. 2 is a side view of another conventional light emitting diode package.
Figure 3:
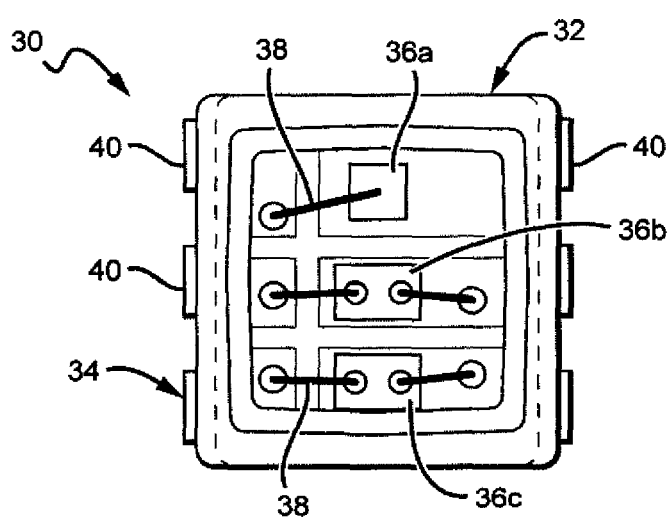
FIG. 3 is a plan view of another conventional light emitting diode package.
Figure 4:
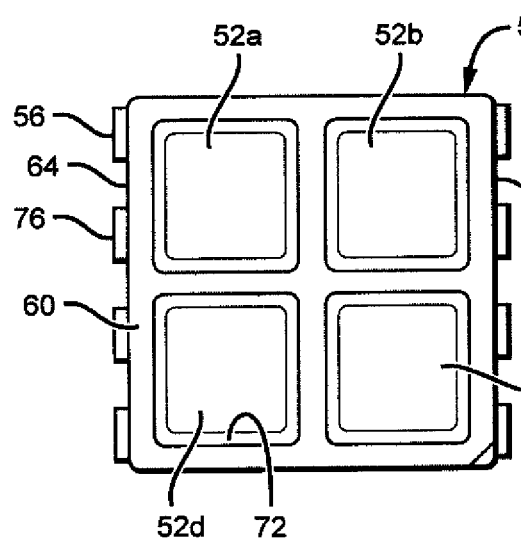
FIG. 4 is a plan view of one embodiment of an LED package according to the present invention.
Figure 5:
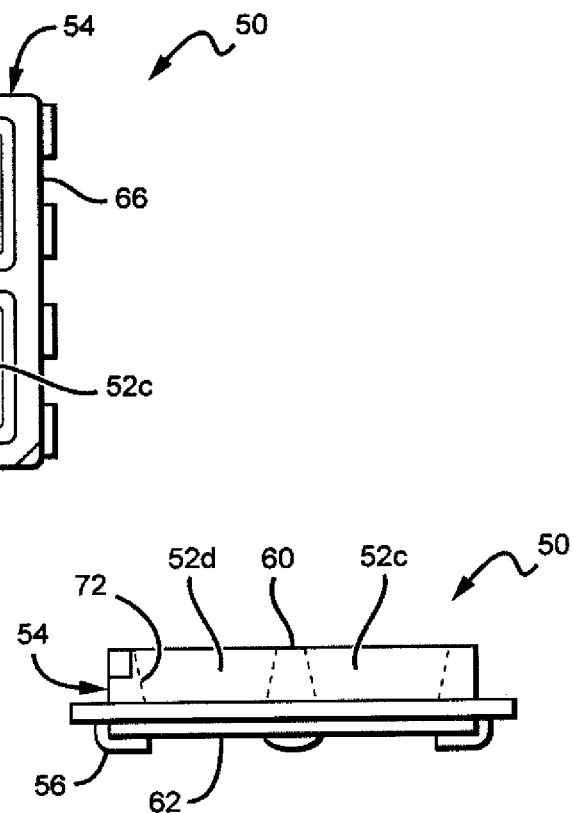
FIG. 5 is a side view of the LED package shown in FIG. 4.
Figure 6:
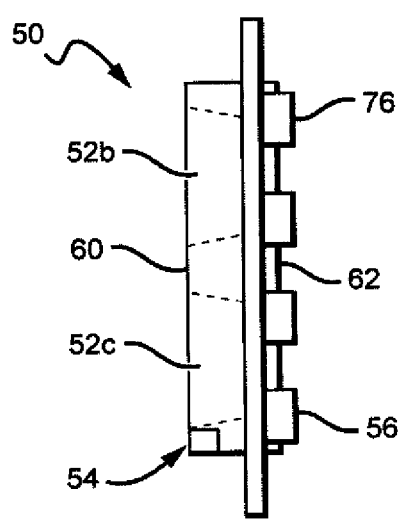
FIG. 6 is another side view of the LED package shown in FIG. 4.

The present invention is directed to improved LED packages and LED displays utilizing the LED packages, with the LED packages according to the present invention comprising "multiple pixel" packages. That is, the packages comprise more than one pixel, with each of the pixels comprising one or more light emitting diodes. The different embodiments comprise different features for applying an electrical signal to the LED in the pixels. In some embodiments, a respective electrical signal can be applied to each of the pixels to control its emission color and/or intensity, while in other embodiments two or more of the pixels can be controlled by the same electrical signal. In embodiments where the pixels have multiple LEDs one or more of the LEDs in each pixel can be controlled by respective signals, while in other embodiments the LEDs in different pixels can be controlled by the same signal. In some of these embodiments, the same signal can be used to control the emission of two or more pixels, while in other embodiments each of the pixels can be controlled be controlled by a respective signal.

In some embodiments, the term pixel is understood to in its common meaning to be an element of an image that can be individually processed or controlled in a display system. In some of these embodiments, some or all of the pixels can comprise red, green and blue emitting LEDs, with at least some of the pixels being arranged to allow for the intensity of each LED in the pixel to be controllable. This allows for each pixel to emit a color of light that is a combination of red, green or blue light, and allows for flexibility in driving each pixel so that it can emit different colors that are a combination of light from the LEDs.

In other embodiments, the packages can comprise pixels that can emit a single color of light, with these packages used in different applications such as lighting or backlighting. In some of these embodiments, the pixel can emit white light and can comprise at least one blue LED with one or more phosphors, with the LED emitting a white light combination of blue and phosphor light. Different ones of these embodiments can allow for control over the individual LEDs in each pixel, while in other embodiments the LEDs can be driven by the same drive signal. In some embodiments the pixels can comprise a one or more white emitting LEDs in combination with a red emitting LED to achieve the desired pixel emission, such as the desired color temperature. In other embodiments, emission of the LEDs in the pixel can be controlled to such that the pixel emits different color temperatures in the cool to warm temperature spectrum.

The packages according to the present invention can have many different shapes and sizes and can be arranged with many different numbers of pixels. In some embodiments, the packages can be square and can have pixels in a format of 2 by 2, 4 by 4, 8 by 8, etc. In other embodiments, the packages can be rectangular shapes and can have pixels in a format with fewer pixels in one direction compared to the pixels in another direction. For example, the packages can have pixel formats of 2 by 3, 4, 5, 6, etc., 3 by 4, 5, 6, 7, etc., or 4 by 5, 6, 7, 8, etc. In still other embodiments, the pixels can be in a linear array of pixels 2, 3, 4, 5, etc. long. These are only some of the shapes for the packages, with others being triangular, circular or non-regular shaped.

The LED package according to the present invention provide certain advantages over the prior art single pixel packages. The LED packages can result in a lower per pixel cost by reducing material costs, such as lead frame materials. The pitch between adjacent pixels can also be reduced while maintaining a lambertian beam profile. By reducing the pitch between pixels, higher resolution displays can be manufactured. The display manufacturing costs can also be reduced by reducing handling costs and pick and place assembly costs. The complexity of the pixel interconnects can also reduced, thereby reducing materials costs and the display manufacturing level. This can also reduce the potential interconnects that could fail over the lifetime of the display.

The present invention can be directed to many different package types, with some of the embodiments below being surface mount devices. It is understood that the present invention can also be used with other package types such as packages with pins for though hole mounting processes.

The LED packages according to the present invention can be used in LED signs and displays, but it is understood that they can be used in many different applications. The LED packages can comply with different industry standards making them appropriate for use in LED based signs, channel letter lighting, or general backlighting and illumination applications. Some embodiments can also comprise a flat top emitting surface making them compatible to mate with light pipes. These are only a few of the many different applications for the LED packages according to the present invention.

Some LED package embodiments according to the present invention can comprise a single LED chip or multiple LED chips and can comprise a reflective cup surrounding the LED chip or chips. The upper surface of casing around each of the reflective cups can comprise a material that contrasts with that of the light emitted by the LED chips. The portion of the casing exposed within the cup, and/or the reflective surfaces within the cup can also comprise a material that is reflective of the light from the LED chips. In some of these embodiments light emitted from the LED chips can be white or other wavelength converted light, and the surface of the submount within the reflective cup and the reflective surfaces of the cup can be white or otherwise reflective of the white or wavelength converted light. The contrasting upper surface of the reflective cup can be many different colors, but in some embodiments is black.

The present invention is described herein with reference to certain embodiments, but it is understood that the invention can be embodied in many different forms and should not be construed as limited to the embodiments set forth herein. In particular, many different LED chips, reflective cup and lead frame arrangements can be provided beyond those described above, and the encapsulant can provide further features to improve the reliability and emission characteristics from the LED packages and LED displays utilizing the LED packages. Although the different embodiments of LED packages are discussed herein as being used in an LED display, the LED packages can be used in many different lighting applications.

It is also understood that when an element such as a layer, region or substrate is referred to as being "on" another element, it can be directly on the other element or intervening elements may also be present. Furthermore, relative terms such as "above" and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 7:
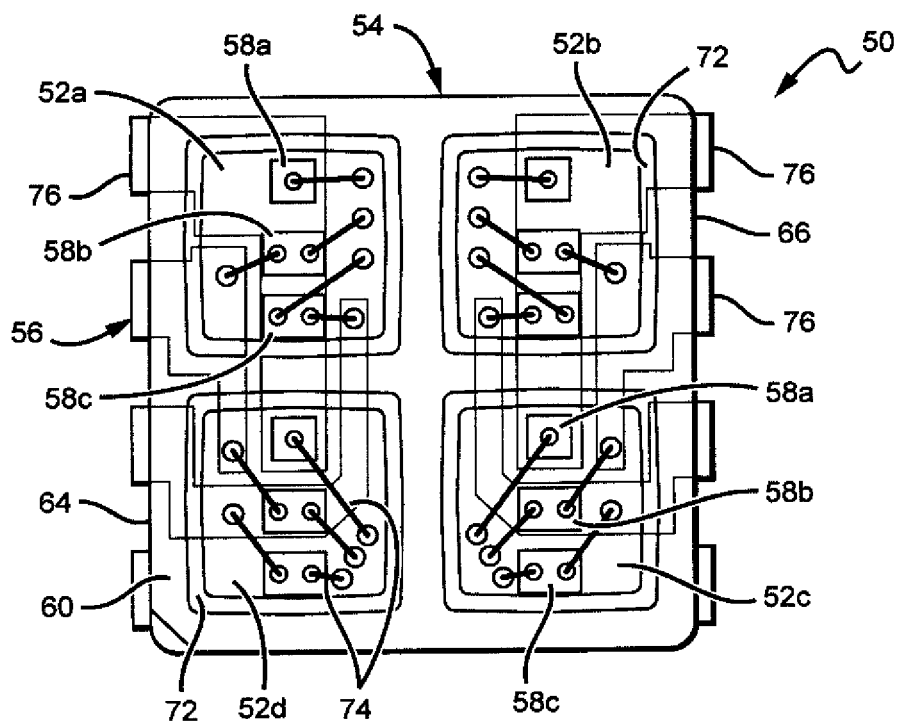
FIG. 7 is a plan view of one embodiment of an LED display according to the present invention.

FIGS. 4-7 show one embodiment of a multiple pixel emitter package 50 according to the present invention, with FIG. 7 in more detail pixel emitters that can be used in some embodiments according to the present invention. The package comprises four pixels 52*a-d* arranged in a 2 by 2 format or layout, with the package 50 having a generally square footprint. The package 50 can comprise features for different mounting methods, with the embodiment shown having features to allow for surface mounting. That is, the package 50 comprises a surface mount device (SMD) with a pin and lead frame structure having pin-outs arranged so the package can be mounted to a structure, such as a printed circuit board (PCB), using surface mount technology. As mentioned above, it is understood that the present invention is also applicable to other emitter package types beyond SMDs, such as pin-mounting emitter packages. The package 50 comprises a casing or submount 54 that carries an integral lead frame 56. The lead frame 56 comprising a plurality of electrically conductive connection parts used to conduct an electrical signal to the package's light emitters, and to also assist in dissipating heat generated by the emitters.

The casing or submount ("casing") 54 can be formed of many different materials or combinations of materials, and can have different material in different section. One acceptable casing material is electrically insulating, such as a dielectric material. The casing 54 can comprise at least partially comprise a ceramic such as alumina, aluminum nitride, silicon carbide, or a polymeric material such as polymide and polyester. In some embodiments, the casing 54 can comprise a dielectric material having a relatively high thermal conductivity, such as aluminum nitride and alumina. In other embodiments the submount 54 can comprise a printed circuit board (PCB), sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board.

The lead frame 56 can be arranged in many different ways and different numbers of parts can be utilized in different package embodiments. The pixels can have the same one or more emitters, such as LEDs, and in some embodiments different pixels can have different numbers of LEDs. As best shown in FIG. 7, the package 50 can comprise three LEDs 58a-c per pixel, and in the embodiment shown the lead frame 56 is arranged to apply an electrical signal to the LEDs 58a-c. The lead frame 56 comprises electrically conductive parts for conducting an electrical signal from the package mounting surface (e.g. PCB) to the LEDs 58a-c. The lead frame can also comprise features that can be included to provide mounting stability for the LEDs and to provide an additional thermal path for dissipating heat from the emitter. The lead frame can also comprise physical features such as holes, cut-outs, etc. to increase the stability and reliability of the package, and in some embodiments to help maintain a watertight seal between components. These different features are described in U.S. patent application Ser. No. 13/192,293 to Chan, at al., entitled Water Resistant Surface Mount Device Package, the entirely of which in incorporated herein by reference.

The fabrication of the lead from 56 may be accomplished by stamping, injection molding, cutting, etching, bending or through other known methods and/or combinations of methods to achieve the desired configurations. For example, the conductive parts can be partially metal stamped (e.g., stamped simultaneously from a single sheet of relevant material), appropriately bent, and fully separated or fully separated following the formation of some or all of the casing.

The lead frame 56 may be made from an electrically conductive metal or metal alloy, such as copper, a copper alloy, and/or other suitable low resistivity, corrosion resistant materials or combinations of materials. As noted, the thermal conductivity of the leads may assist, to some extent, in conducting heat away from the LEDs 58a-c.

The casing 54 can have many different shapes and sizes and in the embodiment shown is generally square or rectangular, with upper and lower surfaces 60 and 62 (best shown in FIGS. 5 and 6), and first and second side surfaces 64 and 66. The upper portion of the casing further comprises for recesses or cavities 72 extending from the upper surface 60 into the body of the casing 54 to the lead frame 56. The LEDs 58a-c for each pixel are arranged on the lead frame 56 in a respective one of the cavities 72 such that light from the LEDs emits from the package 50 through the cavity 72. Each cavity 72 can have angled side surfaces that form a reflective cup around the LEDs 58a-c to help reflect emitter light out of the package 50. In some embodiments, a reflective insert or ring (not shown) may be positioned and secured along at least a portion of a side surface 74 of the cavity 72. The effectiveness of the reflectivity of the ring and the emission angle of the package can be enhanced by tapering the cavity 72 and the ring is carried therein inwardly toward the interior of the casing. By way of example a reflector angle of about 50 degrees provides for a suitable reflectivity and viewing angle.

In some embodiments, the cavities 72 may be at least partially filled with a fill material (or encapsulent) that can protect and positionally stabilize the lead frame 56 and the LED 58a-c. In some instances, the fill material may cover the emitters and the portions of the lead frame 56 exposed through the cavities 72. The fill material may be selected to have predetermined optical properties so as to enhance the projection of light from the LEDs, and in some embodiments is substantially transparent to the light emitted by the package's emitters. The fill material can also be flat so that it is approximately the same level as the upper surface 60, or it can be shaped in a lens, such as hemispheric or bullet shape. Alternatively, the fill material can be fully or partially concave in one or more of the cavities 72. The fill material may be formed from a resin, an epoxy, a thermoplastic polycondensate, glass, and/or other suitable materials or combinations of materials. In some embodiments, materials may be added to the fill material to enhance the emission, absorption and/or dispersion of light to and/or from the LEDs.

The casing 54 may be fabricated of material that is preferably both electrically insulating and thermally conductive. Such materials are well-known in the art and may include, without limitation, certain ceramics, resins, epoxies, thermoplastic, polycondensates (e.g., a polyphthalamide (PPA)), and glass. The package 50 and its casing 54 may be formed and/or assembled through any one of a variety of known methods as is known in the art. For example, the casing 54 may be formed or molded around the lead frame, such as by injection molding. Alternatively, the casing may be formed in sections, for example, top and bottom sections with conductive parts formed on the bottom section. The top and bottom sections can then be bonded together using known methods and materials, such as by an epoxy, adhesive or other suitable joinder material.

Packages according to the present invention can use many different emitters, with the package 50 utilizing LEDs 58a-c. Different embodiments can have different LED chips that emit different colors of light, and in the embodiment shown, each pixel in the package 50 comprises a red, green and blue emitting LED chips that can produce a combined color emission of many different wavelengths including white light.

LED chip structures, features, and their fabrication and operation are generally known in the art and only briefly discussed herein. LED chips can have many different semiconductor layers arranged in different ways and can emit different colors. The layers of the LED chips can be fabricated using known processes, with a suitable process being fabrication using metal organic chemical vapor deposition (MOCVD). The layers of the LED chips generally comprise an active layer/region sandwiched between first and second oppositely doped epitaxial layers, all of which are formed successively on a growth substrate or wafer. LED chips formed on a wafer can be singulated and used in different applications, such as mounting in a package. It is understood that the growth substrate/wafer can remain as part of the final singulated LED chip or the growth substrate can be fully or partially removed.

It is also understood that additional layers and elements can also be included in the LED chips, including but not limited to buffer, nucleation, contact and current spreading layers as well as light extraction layers and elements. The active region can comprise single quantum well (SQW), multiple quantum well (MQW), double heterostructure or super lattice structures.

The active region and doped layers may be fabricated from different material systems, with one such system being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP) or aluminum indium gallium phosphide (AlInGaP) or zinc oxide (ZnO).

The growth substrate/wafer can be made of many materials such as silicon, glass, sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946, 547; and 5,200,022. LEDs can also comprise additional features such as conductive current spreading structures and current spreading layers all of which can be made of known materials deposited using known methods.

The LEDs 58a-c may be mounted to and electrically coupled to the led frame 56 by means of an electrically and thermally conductive bonding material such as a solder, adhesive, coating, film, encapsulant, paste, grease and/or other suitable material. In a preferred embodiment, the LEDs may be electrically coupled and secured to their respective pads using a solder pad on the bottom of the LEDs such that the solder is not visible from the top. Wire bonds 74 (shown in FIG. 7) can be included running between the LEDs 58a-c and the lead frame 56.

Figure 8:
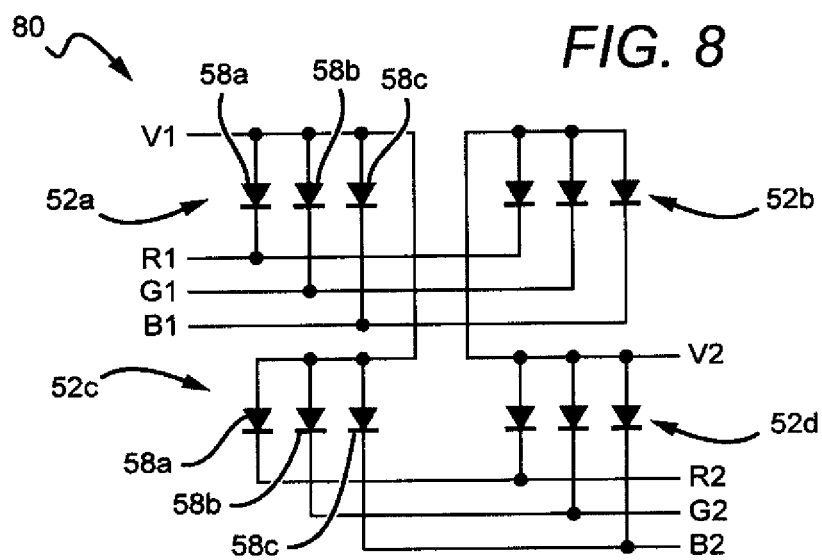
FIG. 8 is a schematic showing the interconnections between the LEDs in one LED package according to the present invention.

The different embodiments of the present invention can have different pin-out arrangement that can depend on different factors such as the number of LEDs, the interconnection of the LEDs, and the level of separate and independent control over each of the pixels and/or each of the LEDs in the pixels. FIG. 7 shows the package 50 with 8 pins 76 in its pin-out structure, and FIG. 8 shows one embodiment of the interconnections structure 80 according to the present invention that can be utilized with an 8-pin pin-out. The interconnections 80 show the four pixels 52a-d, each comprising three LEDs 58a-c, and the electrical connections between the LEDs 58a-c can be provided by the lead frame 56 and/or wire bonds 74 shown in FIG. 7. The electrical signals on pins V1 and V2 provide power to drive the LEDs, with V1 driving the first and third pixels 52a, 52c and V2 driving the other two pixels 52b, 52d. The electrical signal on pins R1, G1 and B1 control emission of the LEDs 58a-c in the first two pixels 52a, 52b and the signal R2, G2 and B2 controlling emission of LEDs 58a-c in the second pixels 52c, 52d. This arrangement allows for dynamic control of pixels 52a-d, each pixel being controlled by a respective combination of the drive and control signals. In the embodiment shown, V1, R1, G1, and B1 control emission of the first pixels 52a and V1, R2, G2 and B2 control emission third pixel 52c. Similarly, V2, R1, G1, and B1 control emission of the second pixel 52b and V2, R2, G2 and B2 control emission fourth pixel 52d.

Figure 9:
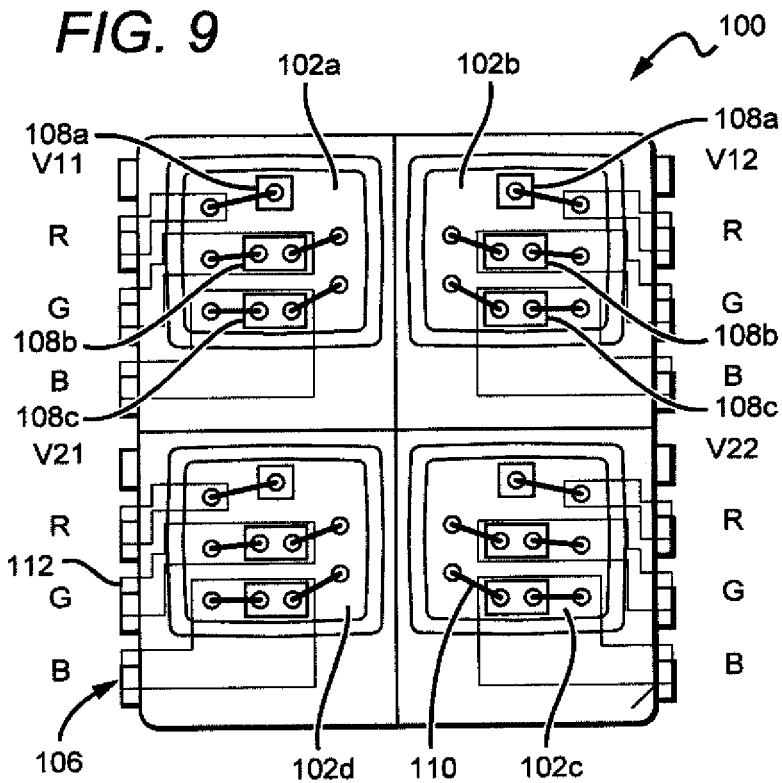
FIG. 9 is a plan view of another embodiment of an LED package according to the present invention.

It is understood that different packages can have different number of pins in their pin-out structures and that the pixels and LEDs can be interconnected in many different ways be different lead frame structures and wire bonds. FIG. 9 shows another embodiment of LED package 100 according to the present invention that also has four pixels 102a-d in a 2 by 2 layout. The package further comprises a casing 104 and lead frame 106, each of which can be manufactured using the same methods and materials as described above. Each of the pixels 102a-d can also comprise one or more LEDs, with the embodiments shown comprising three LEDs 108a-c similar to those described above. The package 100 can also comprise wire bonds 110 to provide electrical connections between the lead frame 106 and the LEDs 108 a-c in the pixels 102a-d.

Figure 10:
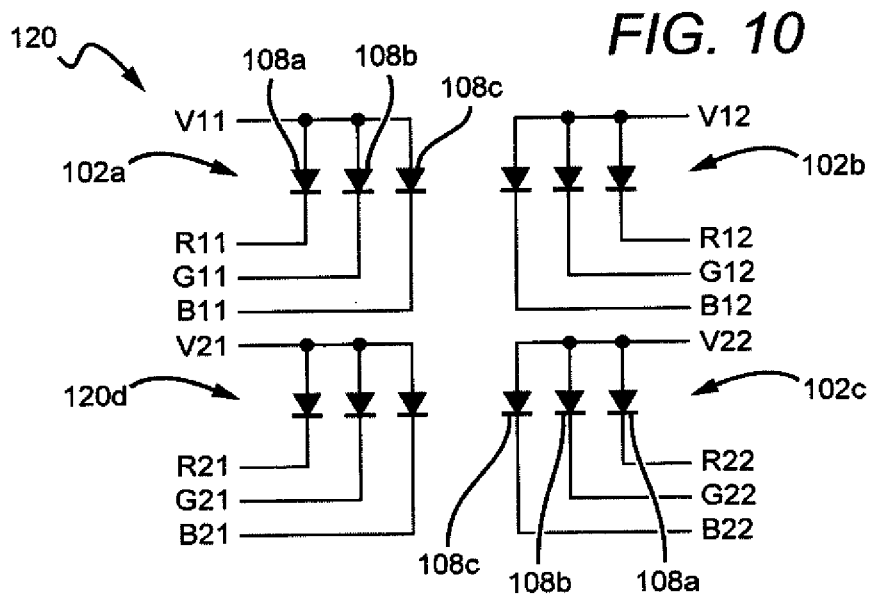
FIG. 10 is a schematic showing the interconnections between the LEDs in another LED package according to the present invention.

The package 100 also comprises a pin-out structure with 16 pins 112, and FIG. 10 shows one embodiment of an interconnection structure 120 according to the present invention that can be used with a structure having 16 pins 112 and four pixels as in the embodiment of FIG. 9. The interconnection structure 120 is provided by the lead frame 106 and wire bonds 110, and allows for discrete control of the pixels 102a-d. That is, each of the pixels 102a-d has its pin to provide a respective power signal and own set of pins to provide control over emission of the LEDs 108a-c in its pixel. For pixel 102a, the power signal can be provided on pin V11, with the signals to control emission of the LEDs 108a-c provided on pins R11, G11, and B11. For pixel 102b, power is provided on V12 and LED control is provided on pins R12, G12 and B12. Power and control is similarly provided to pixel 102c by V22, R22, G22 and B22, and power and control is provided to pixel 102d by V21, R21, G21 and B21. This arrangement requires more pins 112 compared to package 50 described above, but allows for respective control over the emission of each of the pixels 102a-d. These are only two of the many different pin-out and interconnections structures that can be provided by packages according to the present invention.

Figure 11:
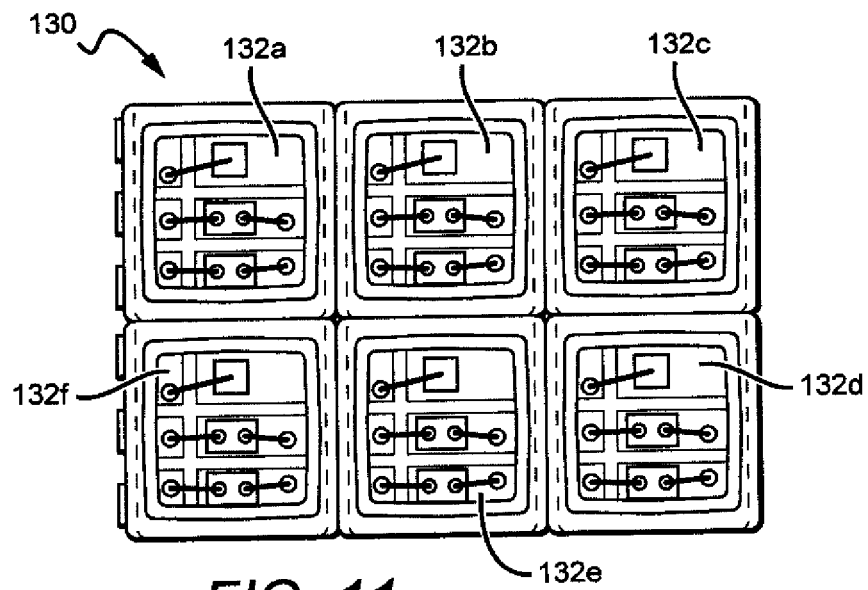
FIG. 11 is a plan view of another embodiment of an LED package according to the present invention.
Figure 12:
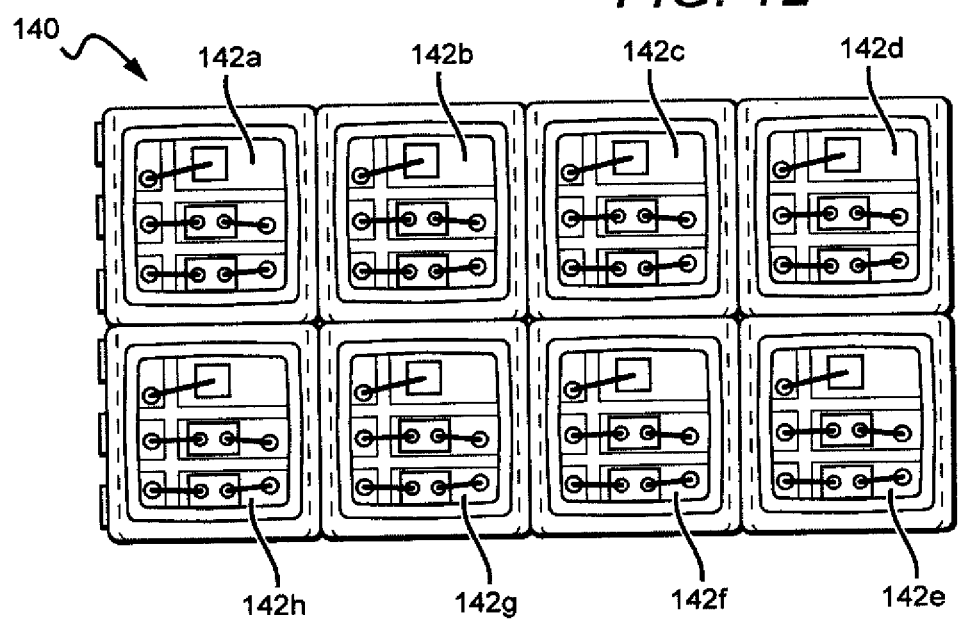
FIG. 12 is a plan view of another embodiment of an LED package according to the present invention.

As discussed above, the packages according to the present invention can be provided with many different matrix layouts beyond those the 2 by 2 layouts shown in packages 50 and 100. FIG. 11 shows another embodiment of a package 130 having six pixels 132a-f arranged in a 2 by 3 matrix layout. FIG. 12 shows another embodiment of a package 140 having eight pixels 142a-h arranged in 2 by 4 matrix layout. Each of the packages 130, 140 comprises a casing, with lead frame, pins and wire bonds similar to those described above but arranged to accommodate a greater number of pixels. Each pixel can also comprise a different number of LEDs, with the pixels shown having three LEDs as described above.

Figure 13:
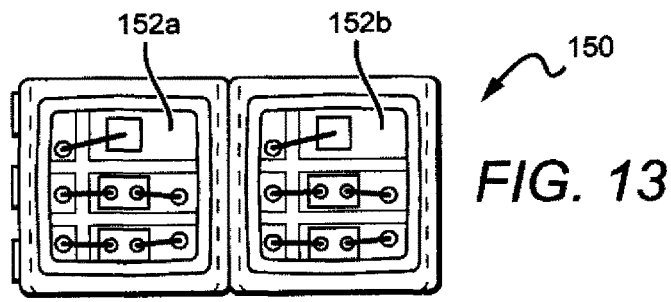
FIG. 13 is a plan view of another embodiment of an LED package according to the present invention.
Figure 14:
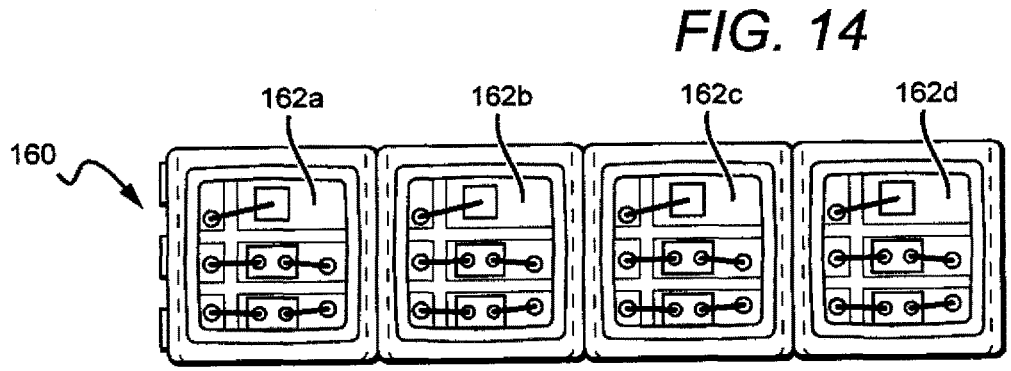
FIG. 14 is a plan view of still another embodiment of an LED package according to the present invention.

The LED packages according to the present invention can also be provided in an array or linear layout. FIG. 13 shows another embodiment of an LED package 150 according to the present invention having two pixels 152a-b arranged in a 2 by 1 linear format. FIG. 14 shows still another embodiment of an LED package 160 according to the present invention having four pixels 162a-d arranged in a 4 by 1 linear format. Each of the packages also comprises the casing, lead frame, pins and wire bonds as described above, and each pixel can comprise LEDs as described above.

Figure 15:
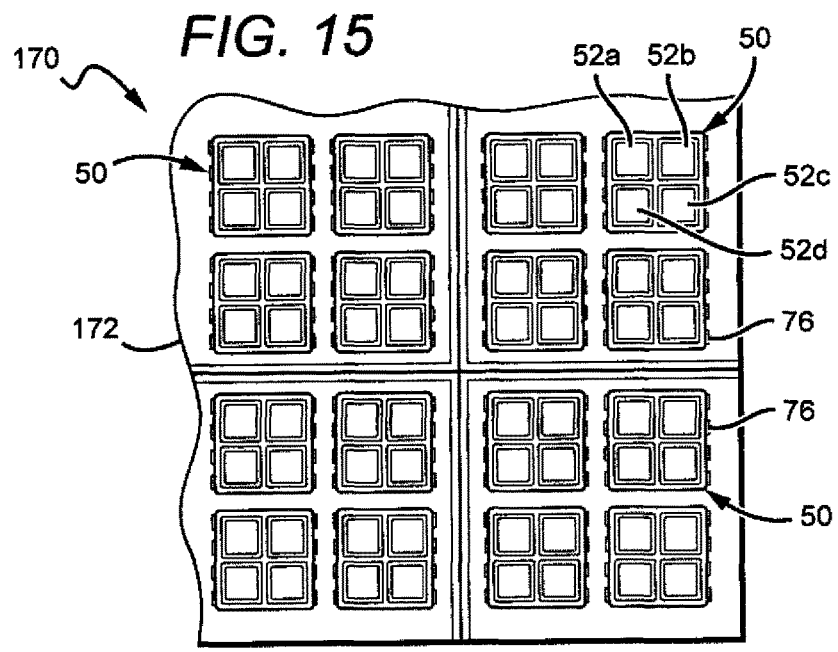
FIG. 15 is a plan view of one embodiment of an LED display according to the present invention.

Multiple ones of the LED packages described above can be mounted together to form a display, with different sized displays having different numbers of packages. FIG. 15 shows a portion of a display 170 having 16 of the 2 by 2

LED packages 50 described above, surface mounted to display panel 172. The packages 50 have eight pins 76 and the panel 172 can comprise the interconnections to allow for dynamic driving of the pixels 52*a-d* in each package 50 as described above. The panel can comprise many different structures arranged in many different ways, with one embodiment at least partially comprising a printed circuit board (PCB) having conductive traces, with the packages surface mounted in electrical contact with the traces. It is understood that typical displays would have many more packages to form the display, with some displays having enough packages to provide hundreds of thousands of pixels.

Figure 16:
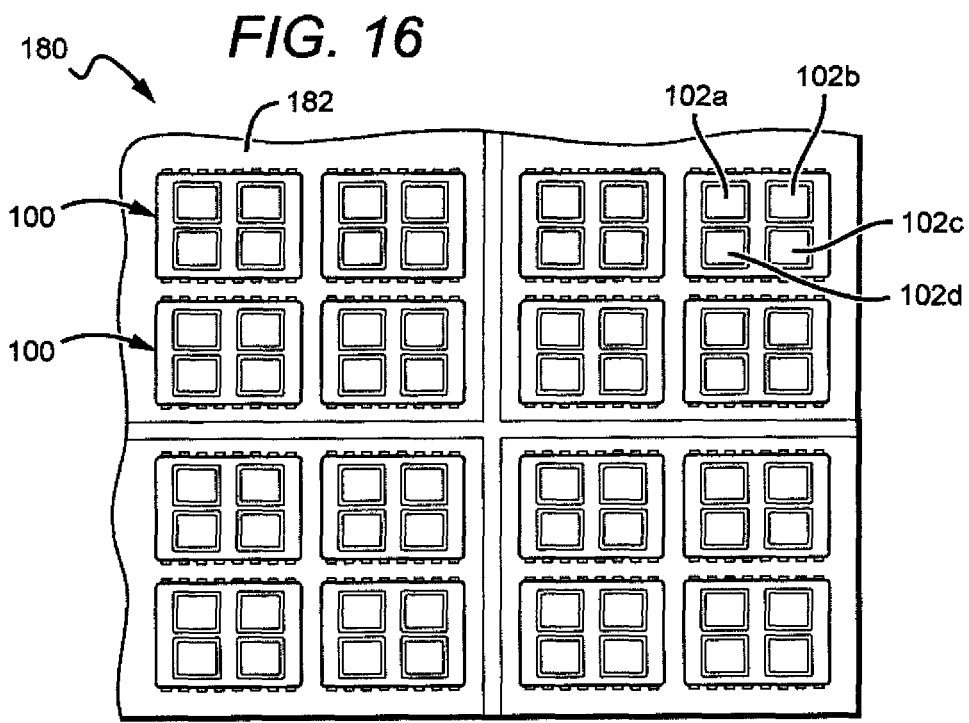
FIG. 16 is a plan view of another embodiment of an LED display according to the present invention.
Figure 17:
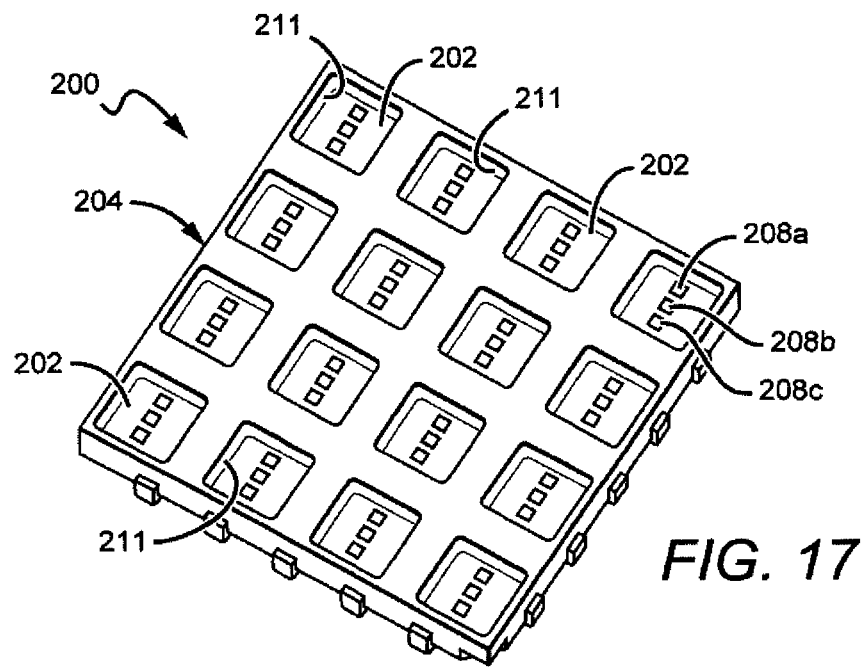
FIG. 17 is a perspective view of another embodiment of and LED package according to the present invention.
Figure 18:
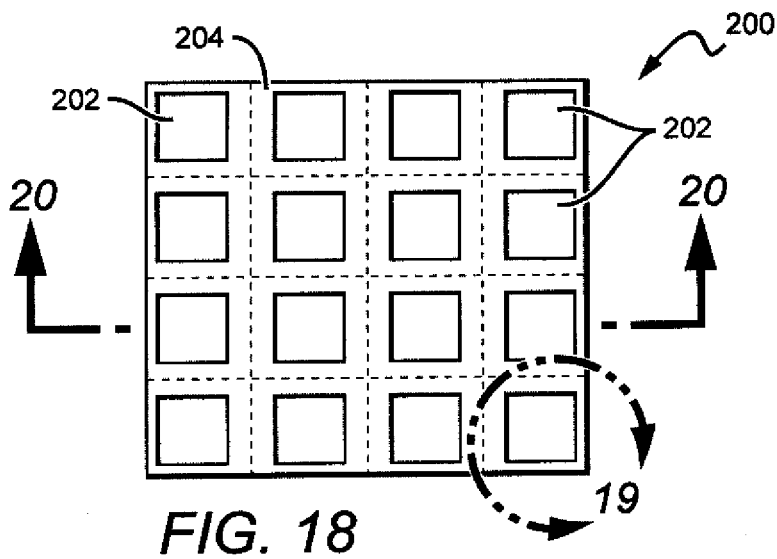
FIG. 18 is a plan view of the LED package shown in FIG. 17 without the LEDs shown in the pixels.
Figure 20:
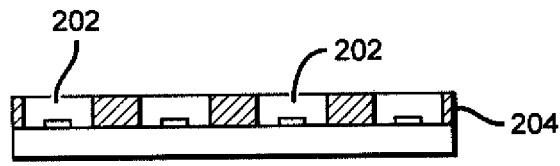
FIG. 20 is a side view of the LED package shown in FIGS. 17 and 18 taken along section lines 20-20.
Figure 19:
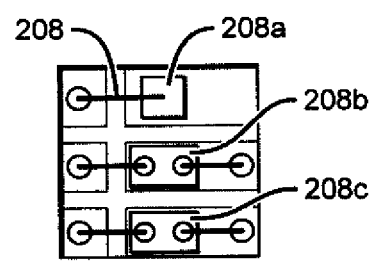
FIG. 19 is a plan view of one of the pixels in the LED package of FIGS. 17 and 18.

The other packages described above can similarly be provided in a display. FIG. 16 shows another portion of a display 180 having 16 of the 2 by 2 LED packages 100 described above, surface mounted to display panel 182. These packages have 16 pins and the panel 182 can comprise the interconnections to allow for discrete driving of the pixels 102*a-d* as described above. The panel 182 can at least partially comprise a PCB with conductive traces, and a full display can also have many more packages 100.

By arranging multiple pixels on a single package, the pixels can be arranged closer to one another (i.e. closer pitch) which can result in an LED display of higher resolution. At the same time, the multiple pixel packages allow for reduced complexity in the LED display compared to using single pixel LED packages. In some embodiments, the LED packages can have a pitch in the range 0.5 to 3.0 millimeters, while in other embodiments the pitch can be in the range of 1.0 to 2.0 millimeters. In still other embodiments, the pitch between pixels can be approximately 1.5 mm.

The packages can also have different sized footprints depending on the number of pixels in the package. For the 2 by 2 LED packages 50, 100 described above the footprint can be square or rectangle with some embodiments having a footprint with the sides being in the range of 2 to 6 millimeter. In other embodiments the sides can be in the range of 3 to 5 millimeters. In some generally square embodiments the sides can be in the range of 3 to 4 millimeters, while in some generally rectangle embodiments, one side can be in the range of 3-4 millimeters, while the other side can be in the range of 4-5 millimeters. It is understood that these are only some of the sizes for the LED packages according to the present invention and that these sizes can increase in proportion to the increased number of pixels in a package.

The different embodiments of LED packages according to the present invention can also comprise square matrix layouts larger than the 2 by 2 matrix layouts described above, including 4 by 4, 5 by 5, 6 by 6, etc. FIGS. 17-22 show another embodiment of an LED package 200 according to the present invention comprising 16 pixels 202 arranged in a 4 by 4 matrix layout. The package 200 can comprise a casing 204, lead frame 206 and wire bonds 208 (shown in FIG. 19), made of the same materials by the same processes as those described above. Each pixel can also comprise one or more LEDs, with the embodiment shown having pixels comprising three LEDs 208*a-c* similar to those described above.

Figure 21:
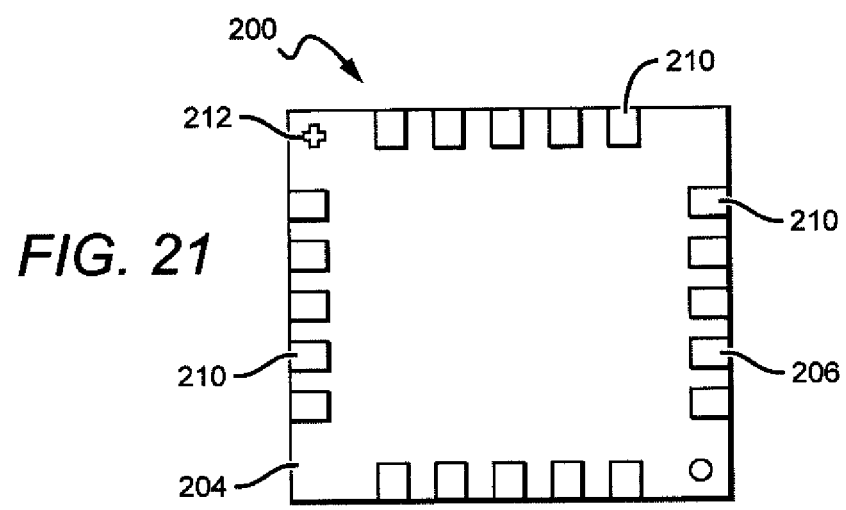
FIG. 21 is a bottom view of the LED package shown in FIGS. 17 and 18.
Figure 22:
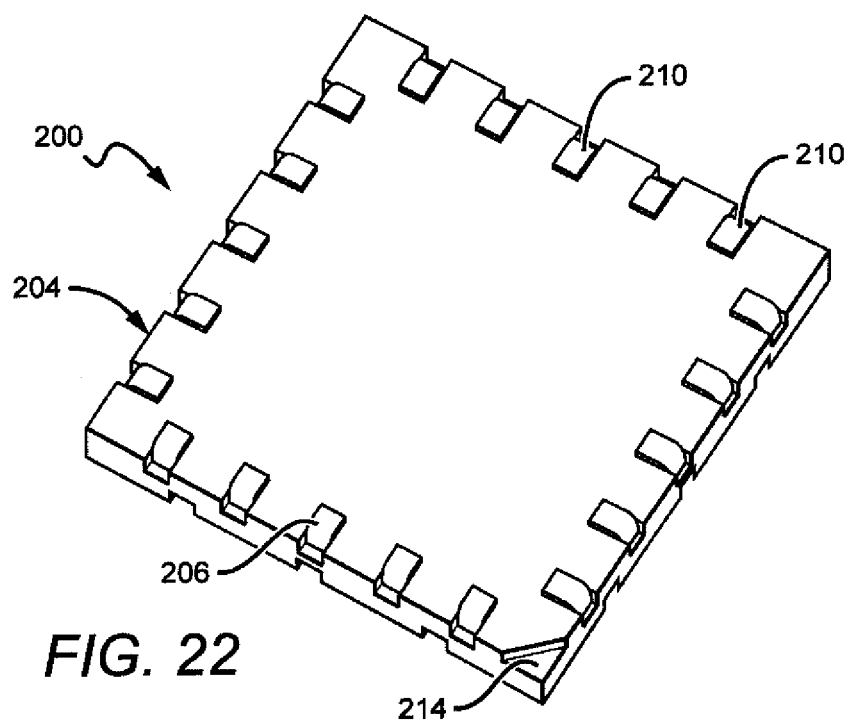
FIG. 22 is bottom perspective view of the LED package shown in FIGS. 17 and 18.

Different embodiments of the package 200 can have lead frames with different number of pins, with the lead frame and wire bonds interconnecting the LEDs in different ways. In the embodiment shown, lead frame 206 comprises a pin-out structure having 20 pins 210 as best shown in FIGS. 21 and 22. The pins 210 run from the side surface of the package and are bent underneath the casing 204 to provide for convenient surface mounting, such as to a display panel. The bottom surface of the package 200 can also comprise polarity indicators that can be used by pick and place machines to mount the packages in the proper orientation. Referring now to FIG. 21 a "+" shaped polarity indicator 212 is provided in a corner of the package 200, but is understood that the polarity indicators can take many different shapes and can be in many different locations. For example, FIG. 22 provides a triangle shaped polarity indicator 214 in a different corner of the package 200.

Figure 23:
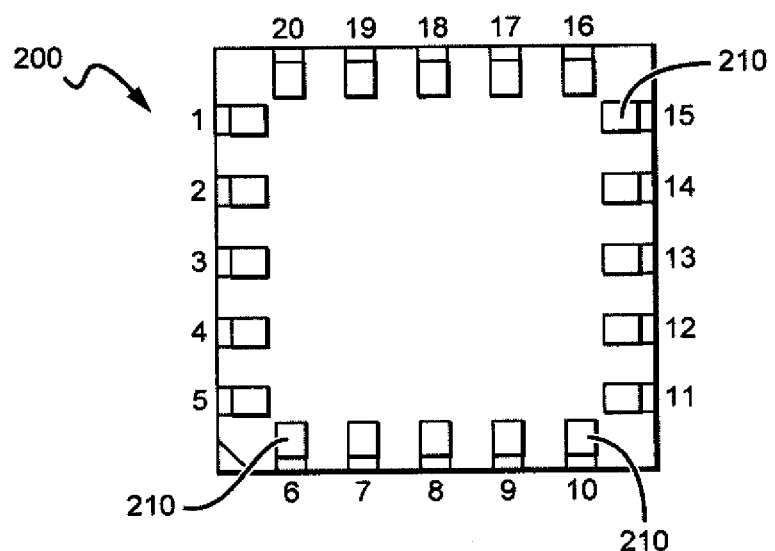
FIG. 23 is another bottom view of the LED package shown in FIGS. 17 and 18 with one pin numbering arrangement.
Figure 24:
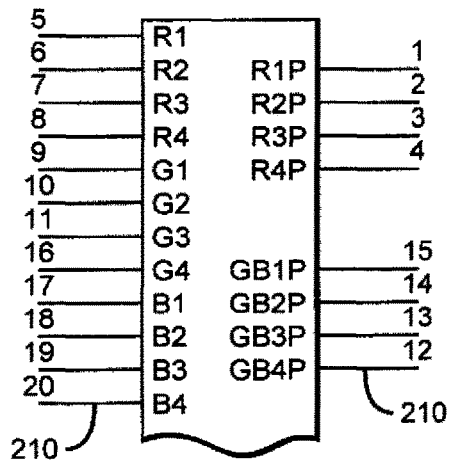
FIG. 24 is a schematic of one embodiment of the pin designations in one embodiment of an LED package according to the present invention.

Referring now to FIG. 23 the 20 pins 210 are numbered 1-20 around the perimeter of the package. FIG. 24 shows the function performed by the electrical signal provided on the different pins 210. Pins 1-4 are designated R1P, R2P, R3P and R4P, with each providing power to the red LEDs in four of the pixels. Pins 12-15 are designated GB1P, GB2P, GB3P and GB4P, with each providing power to the green and blue LEDs in four of the pixels. Pins 5-8 are designated R1, R2, R3 and R4, with each controlling the emission of red LEDs in four of the pixels. Similarly, pins 9-11 and 16 are designated G1, G2, G3 and G4, with each controlling the emission of green LEDs in four of the pixels. Finally, pins 17-20 are designated B1, B2, B3 and B4, with each controlling the emission of blue LEDs in four of the pixels.

Figure 25:
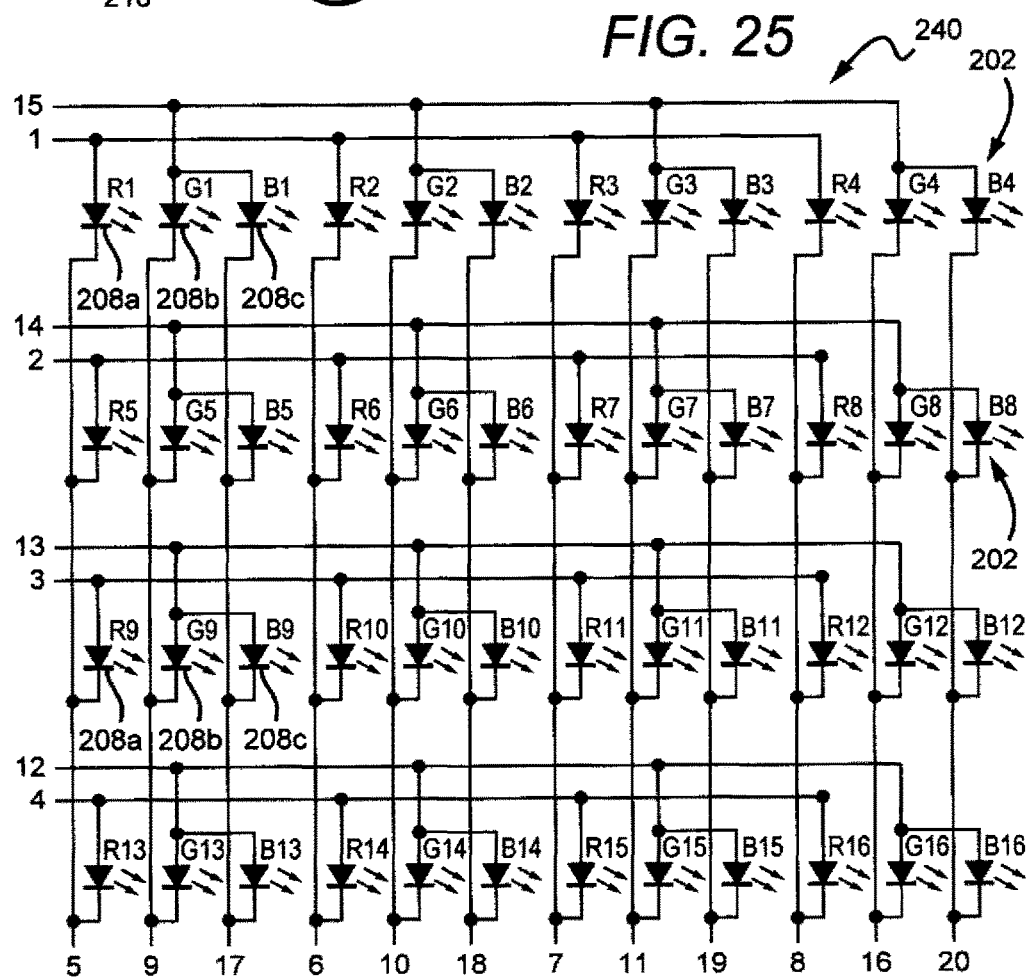
FIG. 25 is a schematic showing the interconnections between the LEDs in on LED package according to the present invention utilizing the pin designations shown in FIG. 24.

FIG. 25 shows one embodiment of the interconnections 240 between the LEDs in the different pixels when utilizing the pin out designations shown in FIG. 24. The each electrical signal applied to pins 1-4 (R1P-R4P) applies power to the red LEDs 208*a* in a respective row of pixels 202, while the signal applied to pins 5-8 controls emission of the red LEDs 208*a* in a column of pixels 202. This row and column arrangement allows for controlling the emission of individual red LEDs. For example, the emission of the red LED R8 in the second row and second column can be controlled by the electrical signals applied to pin 2 (R2P) and pin 6 (R2).

A similar approach can be used for controlling illumination of the green and blue LEDs 208*b*, 208*c*. The each electrical signal applied to pins 12-15 (GB1P-GB4P) applies power to the green and blue LEDs 208*b*, 208*c* in a respective row of pixels 202. The signal applied to pins 9-11 and 16 (G1-G4) controls emission of the green LEDs 208*b* in a respective column of pixels 202, and the signal applied to pins 17-20 (B1-B4) controls emission of the blue LED 208*c* in a respective column of pixels 202. This row and column arrangement allows for controlling the emission of individual green and blue. For example, the emission of the green LED G8 in the pixel in the second row and second column can be controlled by the electrical signals applied to pin 14 (GB2P) and pin 10 (G2). The emission of the blue LED B8 in the pixel in the second row and second column can be controlled by the electrical signals also applied to pin (GB2P) and pin 18 (B2). This interconnect arrangement is only one of the many that can used in embodiments according to the present invention.

Figure 26:
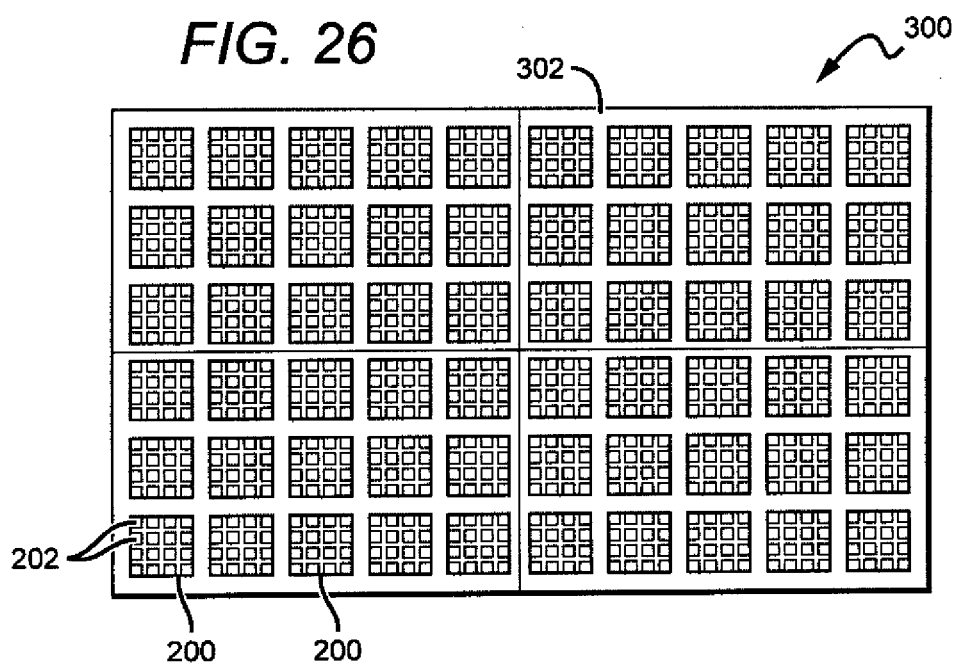
FIG. 26 is a plan view of another embodiment of an LED display according to the present invention.

As with the packages described above, multiple ones of the 4 by 4 LED packages can be mounted together to form a display, with different sized displays having different numbers of packages. FIG. 26 shows one embodiment of a display or a portion of a display 300 having 60 of the 4 by 4 packages 200 mounted to a display panel 302 in a 6 by 10 layout. The panel 302 can comprise the interconnections for the 20 pin pin-out structure for the packages 200 to allow for driving of the pixels 202. The panel 302 can comprise many different structures arranged in many different ways, with one embodiment at least partially comprising a printed circuit board (PCB) having conductive traces, with the packages surface mounted in electrical contact with the traces.

Figure 27:
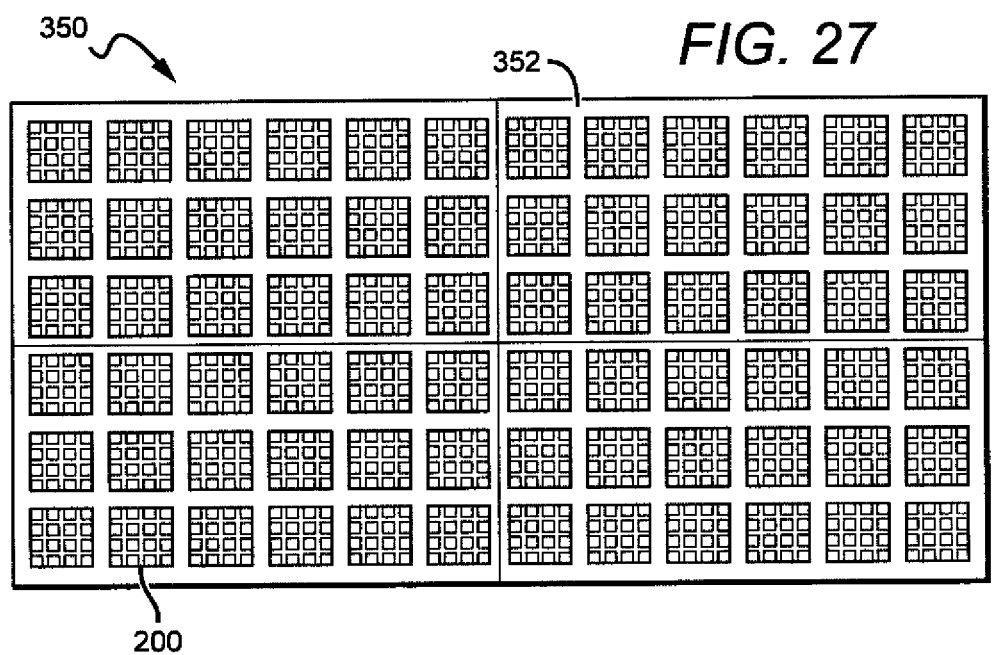
FIG. 27 is a plan view of another embodiment of an LED display according to the present invention.

FIG. 27 shows another embodiment of a display 350 having 70 of the 4 by 4 LED packages mounted on a display panel 352 in a 6 by 12 arrangement. The panel 352 can comprise the interconnections for the 20 pin pin-out structure for the packages 200 to allow for driving of the pixels 202. It is understood that typical displays would have many more packages to form the display, with some displays having enough packages to provide hundreds of thousands of pixels.

Referring again to FIG. 17, the package 200 can be arranged such that the upper surface of the casing 204 has a color that contrasts with that of the light emitted from the package 200 through the recess/cavity 211. In most embodiments, light emitted from the cavity 211 can comprise a combination of light emitted by the LEDs 208a-c. In some embodiments, the LEDs can emit a white light and the upper surface of the casing can comprise a color that contrasts with white light. Many different colors can be used such as blue, brown, grey, red, green, purple, etc., with the embodiment shown having a black color on its upper surface. The black coloring can be applied using many different known methods. It can be applied during molding of the casing 204, or can be applied at a later step in the package fabrication process using different methods such as screen printing, ink jet printing, painting, etc. LED packages with contrasting faces are described in U.S. patent application Ser. No. 12/875,873 to Chan, et al., entitled LED Package With Contrasting Face, the entirely of which in incorporated herein by reference.

Although the present invention has been described in detail with reference to certain preferred configurations thereof, other versions are possible. The packages can have many different shapes and sizes, can be arranged in many different ways and can be made of many different materials. The pixel cavities can be arranged in many different ways and in many different patterns. The pixels can be interconnected using many different features and with many interconnect structures Therefore, the spirit and scope of the invention should not be limited to the versions described above.

We claim:

1. A solid state emitter package, comprising:
multiple pixels each having at least one solid state emitter and a reflector; and
a common submount carrying electrical signals for controlling an emission of said multiple pixels, said electrical signals comprising a first power signal for driving a first of said pixels and a second power signal for driving a second of said pixels, wherein said common submount comprises a lead frame, wherein said first power signal and said second power signal are distinct;
said electrical signals further comprising a control signal for controlling at least one of said first and second of said pixels.

2. A package of claim 1, wherein said submount is arranged for independently controlling the emission of said first and second pixels.

3. The package of claim 1, wherein said first or second pixel emits a white light.

4. The package of claim 1, wherein said at least one solid state emitter comprises a light emitting diode (LED).

5. The package of claim 4, wherein at least one of said pixels comprises a blue emitting LED with a phosphor.

6. The package of claim 4, wherein at least one of said pixels comprises a white emitting LED and a red emitting LED.

7. The package of claim 2, wherein said pixels are controllable to emit different temperatures of white light.

8. The package of claim 2, wherein said pixels are controllable to emit different colors.

9. The package of claim 2, wherein said pixels are controllable to emit different wavelengths of light.

10. The package of claim 2, wherein each of said first and second pixels comprise red, green and blue LEDs.

11. The package of claim 1, wherein said submount comprises a casing, with a pin and lead frame structure integral to said casing.

12. The package of claim 11, further comprising a plurality of cavities in said casing, each cavity defining a pixel.

13. The package of claim 12, wherein each cavity comprises at least one solid state light emitter.

14. The package of claim 11, further comprising a contrasting area on the top surface of said casing.

15. The package of claim 1, wherein said submount at least partially comprises a ceramic, a printed circuit board, a metal core printed circuit board, or an FR-4 board.

16. The package of claim 1, wherein said submount comprises a pin and lead frame structure.

17. The package of claim 1, wherein said pixels are in a matrix layout.

18. The package of claim 1, wherein said pixels are in a square matrix layout.

19. The package of claim 1, wherein said pixels are in a linear array layout.

20. The package of claim 1, further comprising pins to allow for surface mounting of said package.

21. The package of claim 1, wherein an emitter power signal is shared by at least two pixels and an emitter control signal is shared by at least two pixels.

22. The package of claim 1, wherein said pixels are arranged in a matrix layout, wherein an emitter power signal is shared by a row of pixels and an emitter control signal is shared by a column of said pixels.

23. A multiple pixel emission package, comprising:
a casing with a plurality of cavities, each cavity comprising at least one light emitting diode (LED) and each cavity comprising a reflective cup; and
a lead frame structure integral to said casing, said at least one LED from each said cavity mounted to said lead frame structure, said package capable of receiving electrical signals for controlling an emission from a first and second of said cavities;
said electrical signals comprising a first power signal for driving a first LED from said first of said cavities and a second power signal for driving a second LED from said second of said cavities;
said electrical signals further comprising a control signal for controlling at least one of said first LED and second LED, wherein a first control signal for said first LED is distinct from a second control signal for said second LED.

24. The package of claim 23, arranged to receive electrical signals to independently control emission from said first and second of said cavities.

25. The package of claim 23, wherein said each said cavity and its corresponding said at least one LED comprise a pixel.

26. The package of claim 23, wherein the emission from said first and second cavities are controllable to emit different colors.

27. The package of claim 23, wherein each of said cavities comprises red, green and blue LEDs.

28. The package of claim 23, further comprising a contrasting area on the top surface of said casing.

29. The package of claim 23, wherein said pixels are in a matrix or linear layout.

30. The package of claim 23, wherein said pixels are in a square matrix layout.

31. The package of claim 23, wherein said pixels are in a linear array layout.

32. The package of claim 23, further comprising a pin-out arranged to allow for surface mounting of said package.

33. The package of claim 23, wherein one of said power signals is shared by at least two LEDs in two cavities and at least one control signal is shared by at least two LEDs in two cavities.

34. The package of claim 23, wherein said cavities are arranged in a matrix layout, wherein one of said power signals is shared by the LEDs in a row of pixels and said control signal is shared by the LEDs in a column of said cavities.

35. A light emitting diode (LED) display, comprising:
a submount comprising a lead frame; and
a plurality of LED packages each mounted on the submount to generate a message or image, at least some LED packages of the plurality of LED packages comprising multiple pixels each having at least one LED and a reflector, and
wherein each LED package of the plurality of LED packages are capable of receiving electrical signals for controlling an emission of at least a first and second of said multiple pixels,
wherein said at least some LED packages are arranged to receive electrical signals to independently control emission of at least a first and second of said pixels;
said electrical signals comprising a first power signal for driving a first of said pixels and a second power signal for driving a second of said pixels, wherein said first power signal and said second power signal are distinct;
said electrical signals further comprising a control signal for controlling at least one of said first and second of said pixels.

36. The LED display of claim 35, wherein at least some of said packages comprises a surface mount device (SMD).

37. The LED display of claim 35, wherein said first and second pixels comprising a pin and lead frame structure carrying electrical signals controlling the emission of said pixels.

38. The LED display of claim 35, wherein said first and second pixels are controllable to emit different colors.

39. The LED display of claim 35, wherein said at least one LED comprises red, green and blue LEDs.

40. The LED display of claim 35, wherein said pixels are in a matrix or linear layout.

41. A solid state emitter package, comprising:
a plurality of pixels, each pixel of the plurality of pixels comprising at least one solid state emitter and a reflector; and
a common submount carrying electrical signals for controlling an emission of the plurality of pixels,
wherein said common submount comprises a casing and a lead frame coupled to at least a first pixel and a second pixel of the plurality of pixels, wherein part of said lead frame extends from a side surface of said casing and runs underneath said casing, in which the electrical signals comprise at least a first power signal for driving the first pixel and a second power signal for driving the second pixel, the first power signal being distinct from the second power signal;
said electrical signals further comprising a control signal for controlling at least one of said first and second of said pixels.

* * * * *